United States Patent [19]
Watanabe et al.

[11] Patent Number: 5,618,636
[45] Date of Patent: Apr. 8, 1997

[54] THIN FILM MULTI-LAYER STRUCTURE AND METHOD FOR MANUFACTURING THE SAME

[75] Inventors: Manabu Watanabe; Kazuaki Satoh, both of Kawasaki, Japan

[73] Assignee: Fujitsu Limited, Kawasaki, Japan

[21] Appl. No.: 404,881

[22] Filed: Mar. 16, 1995

[30] Foreign Application Priority Data

Mar. 18, 1994 [JP] Japan ..................... 6-048751

[51] Int. Cl.⁶ .................. B32B 15/08; H05K 1/03; H05K 3/46
[52] U.S. Cl. ............ 428/626; 428/686; 428/458; 174/258; 427/96; 427/409; 427/536
[58] Field of Search .................... 428/607, 626, 428/458, 686; 174/258; 427/409, 535, 536, 388.2, 388.3, 96

[56] References Cited

U.S. PATENT DOCUMENTS 4,937,133  6/1990  Watanabe et al. ............. 428/458
5,089,355  2/1992  Morita et al. ............. 428/626
5,300,364  4/1994  Hase et al. ............. 428/458

*Primary Examiner*—John Zimmerman
*Attorney, Agent, or Firm*—Nikaido, Marmelstein, Murray & Oram LLP

[57] ABSTRACT

A thin film multi-layer structure includes a plurality of metal thin film layers, and a plurality of layers made of polyimide. The plurality of metal thin film layers and the plurality of layers made of polyimide are stacked in a predetermined order, the plurality of layers made of polyimide being grouped into a first group and a second group including at least a layer located at a top of the plurality of layers. A Young's modulus value of the polyimide of which each layer in the second group is made is less than that of the polyimide of which each layer in the first group is made and a thermal expansion coefficient of the polyimide of which each layer in the first group is made is less than that of the polyimide of which each layer in the second group is made.

13 Claims, 9 Drawing Sheets

STEP 1
F I G. 5A
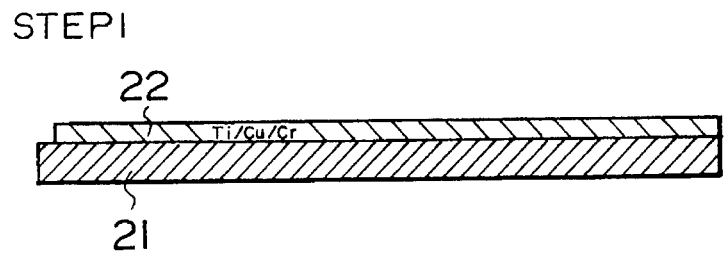
STEP 2
F I G. 5B
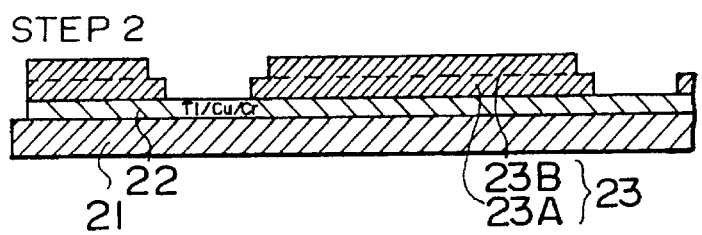
STEP 3
F I G. 5C
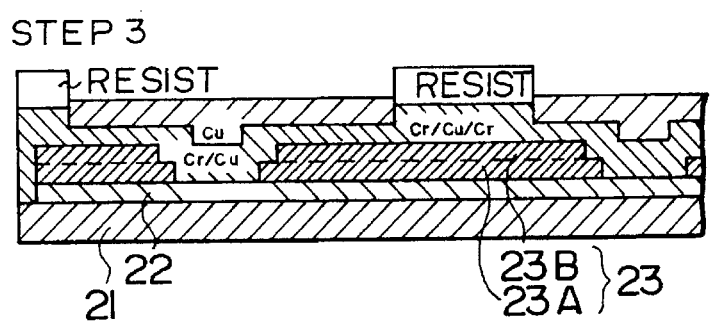
STEP 4
F I G. 5D
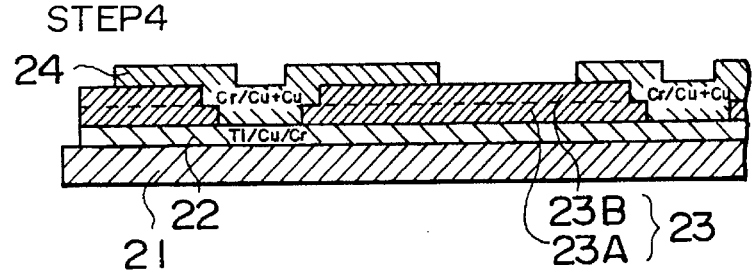

STEP 8

STEP 9

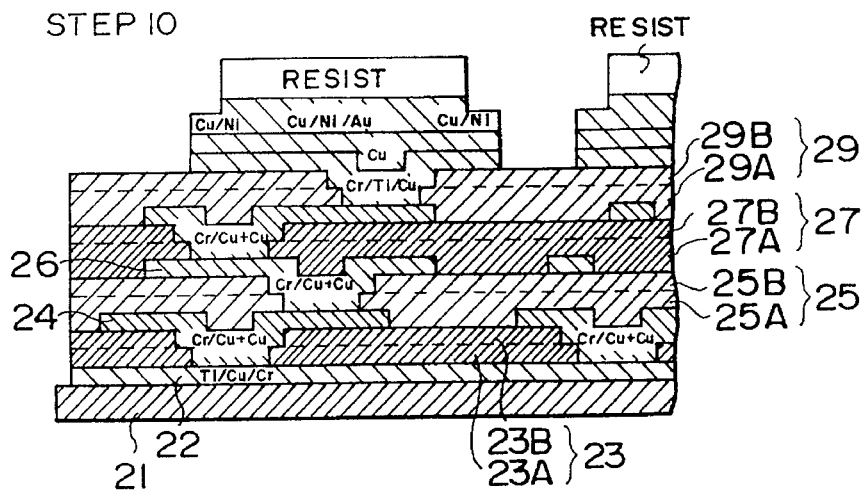
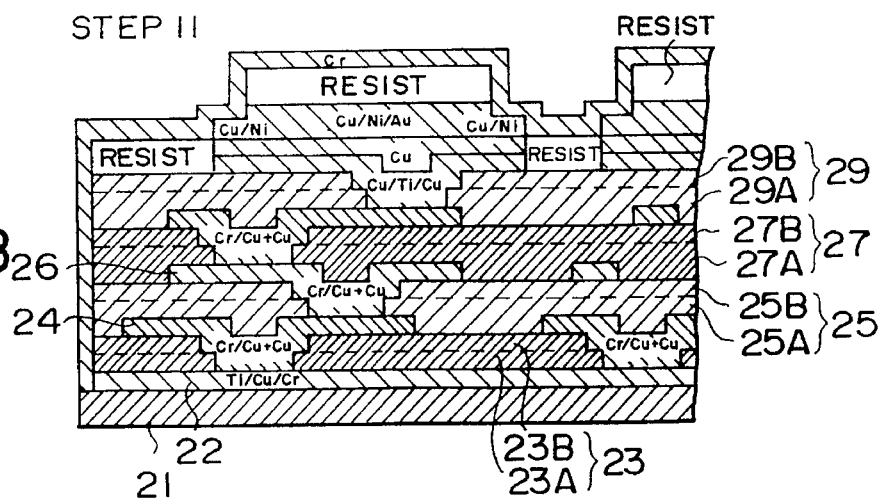

THIN FILM MULTI-LAYER STRUCTURE AND METHOD FOR MANUFACTURING THE SAME

BACKGROUND OF THE INVENTION (1) Field of the Invention

The present invention generally relates to a thin film multi-layer structure and a method for manufacturing the same, and more particularly to a thin film multi-layer structure having a plurality of metal layers and insulating layers made of polyimide used as interlayer insulation layers and a surface protection layer.

(2) Description of the Related Art

In a thin film multi-layer wiring board, interlayer insulation layers and a surface protection are made of polyimide. In order to prevent the board from being bent by residual stress generated in the interlayer insulation layers and the surface protection layer, the polyimide having a low thermal expansion coefficient is used for the interlayer insulation layers and the surface protection layer. The polyimide having a low thermal expansion coefficient is referred to as a low thermal expansion type polyimide.

FIG. 1 shows a structure of a conventional thin film multi-layer wiring board formed of a plurality of metal layers and interlayer insulation layers and a surface protection layer which are made of polyimide. Referring to FIG. 1, a plurality of thin film layers made of metal such as Cu are stacked on a substrate 1 made of AlN by using a sputtering process, a plating process and an etching process.

The metal thin film layers and the interlayer insulation layers and the surface protection layer made of polyimide are formed as follows.

Ti, Cu and Cr are successively spattered on the surface of the substrate 1 so that a thin film layer 2 is formed on the substrate 1. The thin film layer 2 is shaped in a predetermined pattern by the etching process. An interlayer insulation layer 3 made of polyimide is formed on the thin film layer 2. After this, Cr, Cu and Cr are successively sputtered on the interlayer insulation layer 3 and a plating resist is formed on the stacked structure of Cr, Cu and Cr. The Cr layer is then etched so that the Cu layer is exposed. After this, a Cu plating process and a panel etching process are applied to the exposed Cu layer so that a predetermined shaped thin film layer 4 is formed.

After this, the above procedure is repeated so that an interlayer insulation layer 5, a thin film layer 6, an interlayer insulation layer 7 and a thin film layer 8 are formed. The surface of the thin film layer 8 is provided with a thin film layer made of Au. Last, a surface protection layer 9 is formed on the surface of the stacked structure formed as described above.

In the above process, to form each of the interlayer insulation layers 3, 5 and 7, photosensitive polyimide is used as the low thermal expansion type polyimide. Lower layer portions 3A, 5A and 7A and upper layer portions 3B, 5B and 7B are separately formed by using exposure and drawing techniques. In FIG. 1, a boundary line between each of the lower layer portions 3A, 5A and 7A and a corresponding one of the upper layer portion 3B, 5B and 7B is shown by a dotted line. Every time one of the low layer portions 3A, 5A and 7A is formed, a pre-baking process is performed. Every time one of the upper layer portions 3B, 5B and 7B is formed, a hard-backing process is performed. In the pre-baking process, the stacked structure is tentatively heated at a first temperature. In the hard-baking process, the stacked structure is completely heated at a second temperature higher than the first temperature.

In the thin film multi-layer wiring board having the above structure, for example, the thin film 2 forms a ground electrode layer, the thin film layer 4 forms a power electrode layer, the thin film layer 6 forms a signal electrode layer and the thin film layer 8 forms a surface layer of the stacked structure. I/O (Input/Output) pins used to relay signals between an external unit and this wiring board are fixed on the thin film layer 8 (the surface layer) by solder. Each of the I/O pins 10 has a core made of Cu, a Ni layer formed on the surface of the core and an Al layer formed on the Ni layer. The diameter and length of each of the I/O pins 10 are respectively equal to about 0.2 mm and 4 mm.

In the thin film multi-layer wiring board having the above structure, a supporting structure (the surface protection layer 9 and/or the interlayer insulation layers) supporting the I/O pins 10 must have an enough strength to be against a force applied to each of the I/O pins 10. That is, although each of the I/O pins 10 which is pushed by a predetermined force in a direction, as shown by an arrow in FIG. 1, parallel to the surface of the wiring board may be broken or bent, it is required that the layers included in the supporting structure of each of the I/O pins 10 are not broken.

In the conventional thin film multi-layer wiring board, the low expansion type polyimide is used as material of which all the interlayer insulation layers and the surface layer are made, as has been described above. On the other hand, in general, the low expansion type polyimide has a large Young's modulus as shown in FIG. 2. Thus, after the hard-baking process is performed for the stacked structure including the layers made of the low expansion type polyimide, the layers are made be friable. As a result, there is a case where the layers included in the supporting structure of an I/O pin are broken when the I/O pin is provided with a force in a direction parallel to the surface of this wiring board before the I/O pin is broken or bent.

SUMMARY OF THE INVENTION

Accordingly, a general object of the present invention is to provide a novel and useful thin film multi-layer structure and a method for manufacturing the same in which the disadvantages of the aforementioned prior art are eliminated.

A specific object of the present invention is to provide a thin film multi-layer structure in which the strength of layers substantially supporting an object such as an I/O pin is improved in a state where the residual stress generated therein is as small as possible.

The above objects of the present invention are achieved by a thin film multi-layer structure comprising: a plurality of metal thin film layers; and a plurality of layers made of polyimide, the plurality of metal thin film layers and the plurality of layers made of polyimide being stacked in a predetermined order, the plurality of layers made of polyimide being grouped into a first group and a second group including at least a layer located at a top of the plurality of layers, wherein a Young's modulus value of the polyimide of which each layer in the second group is made is less than that of the polyimide of which each layer in the first group is made and a thermal expansion coefficient of the polyimide of which each layer in the first group is made is less than that of the polyimide of which each layer in the second group is made.

According to the present invention, since the Young's modulus value of the polyimide of which each layer in the second group is made is less than that of the polyimide of which each layer in the first group is made, the layers in the second group can has the strength enough to substantially support an object such as the I/O pin. In addition, since the thermal expansion coefficient of the polyimide of which each layer in the first group is made is less than that of the polyimide of which each layer in the second group is made, the warp of the structure caused by the residual stress in the layers made of the polyimide can be small.

Another object of the present invention is to provide a method for manufacturing a thin film multi-layer structure in which the strength of layers substantially supporting an object such as an I/O pin is improved in a state where the residual stress generated therein is as small as possible.

The above object of the preset invention is achieved by a manufacturing method of a thin film multi-layer structure comprising the steps of: a) forming a first structure including a plurality of metal thin film layers and a plurality of layers made of polyimide which are stacked in a predetermined order; and b) forming a second structure on the first structure, the second structure including at least a layer made of polyimide which layer is located at a top of the second structure, wherein a Young's modulus of the polyimide of which each layer in the second structure is made is less than that of the polyimide of which each layer in the first structure is made and a thermal expansion coefficient of the polyimide of which each layer in the first structure is made is less than that of the polyimide of which each layer in the second structure is made.

According to the present invention, a manufacturing method of the thin film multi-layer structure described above can be obtained.

BRIEF DESCRIPTION OF THE DRAWINGS

Other objects, features and advantages of the present invention will become apparent from the following detailed description when read in conjunction with the accompanying drawings, in which:

FIGS. 5A, 5B, 5C and 5D, FIGS. 6A, 6B and 6C, FIGS. 7A and 7B, FIGS. 8A and 8B and FIG. 9 are diagrams illustrating steps in a method for manufacturing a thin film multi-layer wiring board according to an embodiment of the present invention.

DESCRIPTION OF THE PREFERRED EMBODIMENTS

Figure 3:
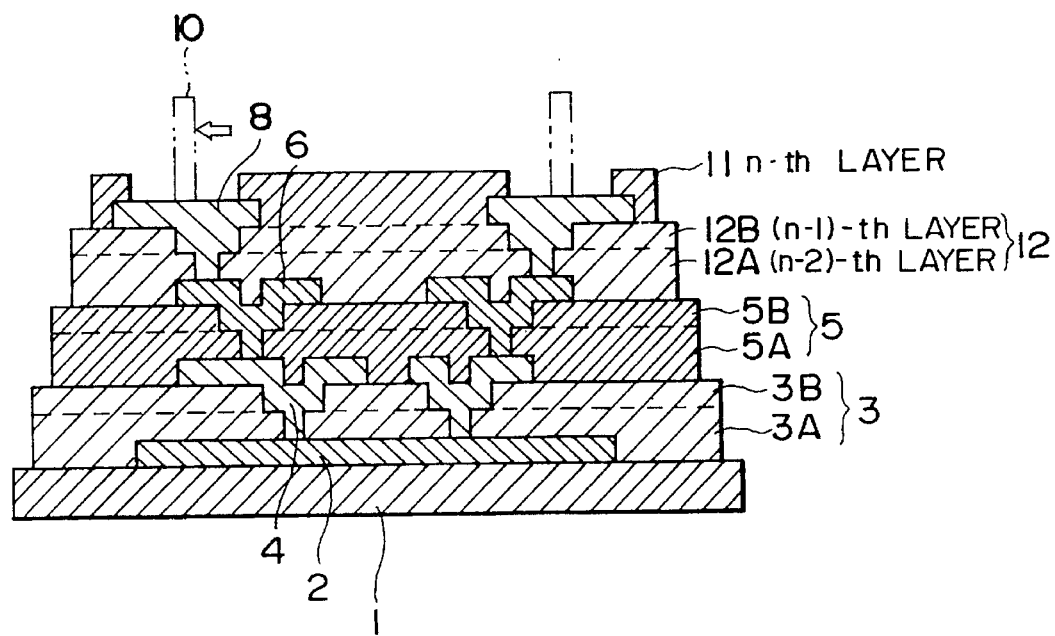
FIG. 3 is a cross sectional view illustrating a thin film multi-layer structure according to the present invention.

A description will be given, with reference to FIG. 3, of an essential part of a thin film multi-layer wiring board according to an embodiment of the present invention. In FIG. 3, those parts which are the same as those shown in FIG. 1 are given the same reference numbers.

Figure 1:
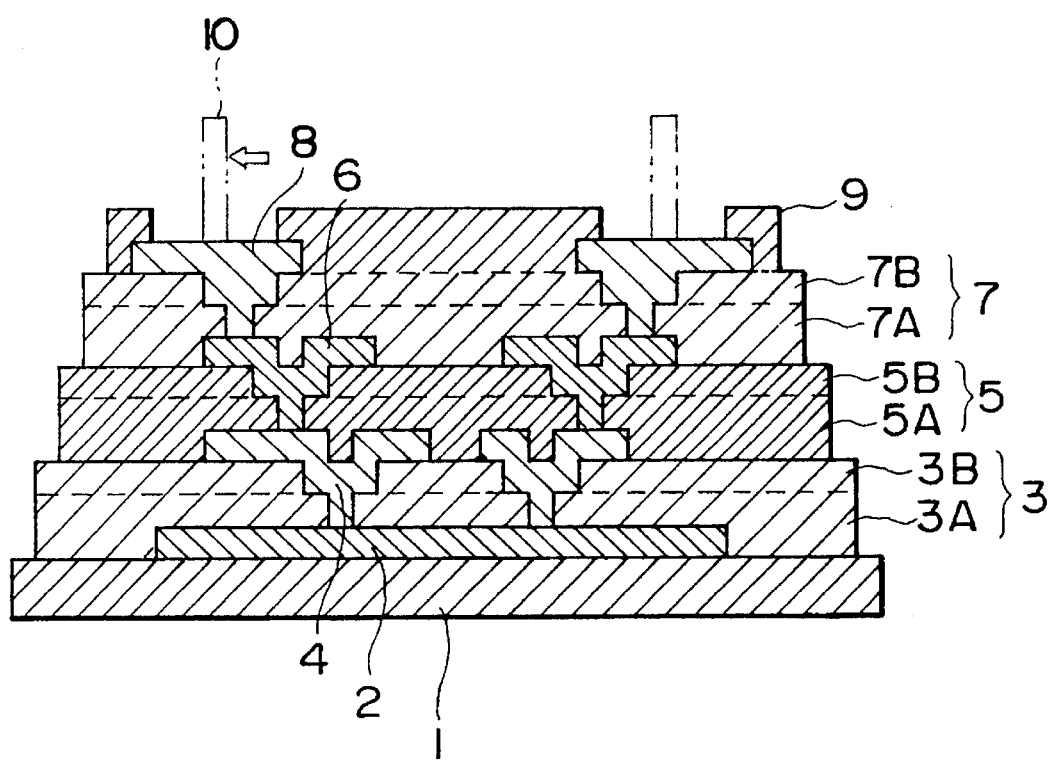
FIG. 1 is a cross sectional view of a thin film multi-layer wiring board having a conventional structure.

Referring to FIG. 3, the thin film layer 2, the interlayer insulation layer 3, the thin film layer 4, the interlayer insulation layer 5, the thin film layer 6, an interlayer insulating layer 12, a thin film layer 8 and a surface protection layer 11 are successively stacked on the substrate 1 in the same manner as those shown in FIG. 1. The respective interlayer insulation layers 3 and 5 are formed of the lower layer portions 3A and 5A and the upper layer portions 3B and 5B. The respective interlayer insulation layers 3 and 5 and a lower layer portion 12A of the interlayer insulation layer 12 are made of the low thermal expansion type polyimide so that the residual stress generated in the layers is small.

The surface protection layer 11 (the n-th layer) which is located at the top of the thin film multi-layer wiring board and an upper layer portion 12B of the interlayer insulation layer 12 (the (n–1)-th layer) are formed of the polyimide having a low Young's modulus value. That is, the Young's modulus value of the polyimide of which the surface protection layer 11 and the upper layer portion 12B of the interlayer insulating layer 12 are made is less than that of the polyimide of which the respective interlayer insulation layers 3 and 5 and the lower layer portion 12A of the interlayer insulation layer 12 are made. The I/O pins 10 are fixed on the thin film layer 8 by solder so as to be substantially supported by a structure including at least the surface layer 11 and the upper layer portion 12B of the interlayer insulation layer 12.

According to the above structure, the Young's modulus value of the polyimide of which the structure including the layers substantially supporting the I/0 pins 10 is made is less than that of the polyimide of which the other layers are made. Thus, the strength of the layers substantially supporting the I/O pins, to which layers the hard-baking process is applied, is improved. In addition, the other interlayer insulation layers 3, 5 and 12A which are the great part of the layers made of the polyimide are made of the low expansion type polyimide. Thus, a state where the residual stress generated in the layers made of polyimide is as small as possible can be maintained.

A description will now be given, with reference to FIG. 4, of a concrete structure of the thin film multi-layer wiring board according to the embodiment of the invention.

Figure 2:
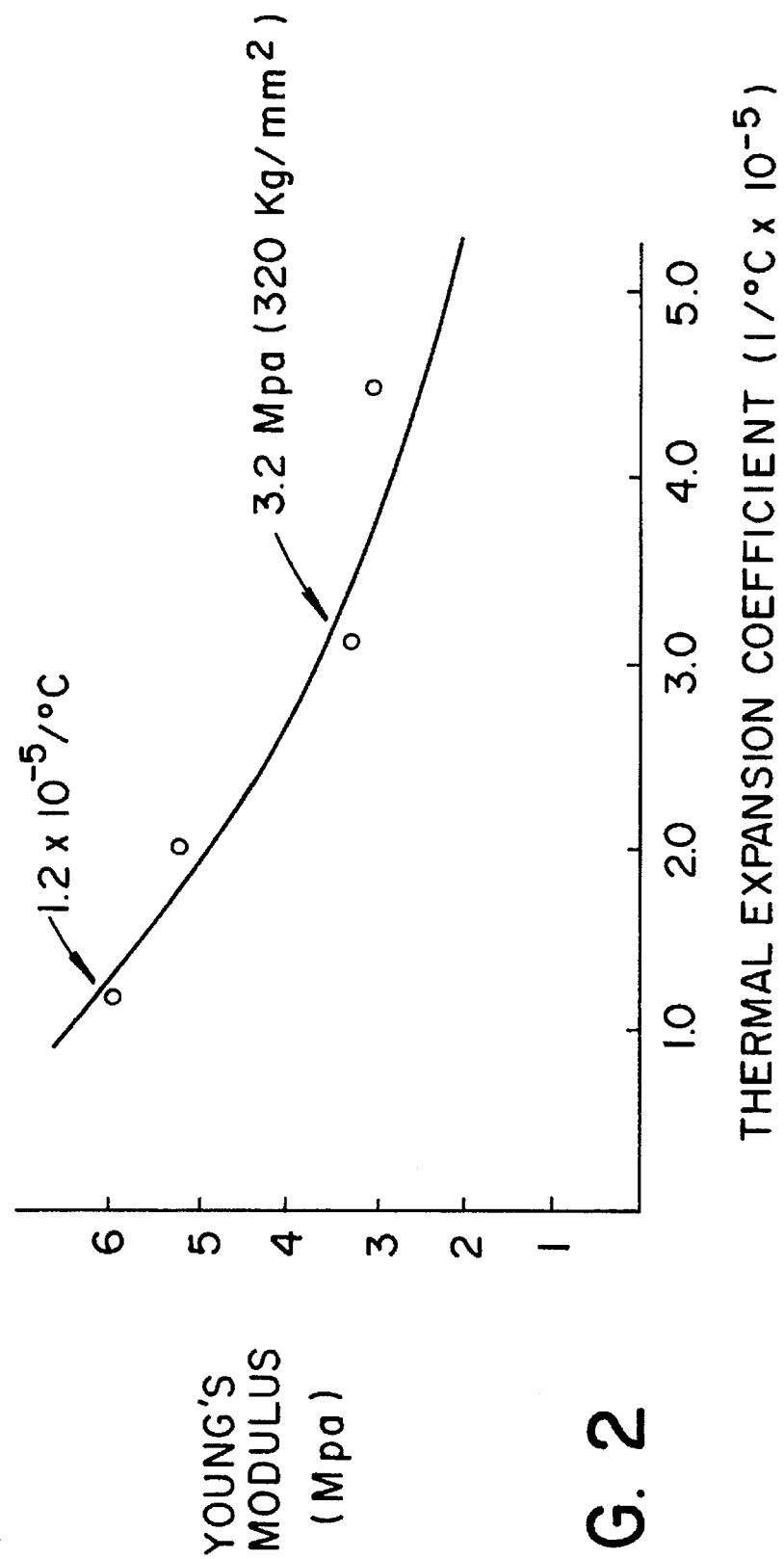
FIG. 2 is a diagram illustrating a relationship between the thermal expansion coefficient of the polyimide and the Young's modulus of the polyimide.
Figure 4:
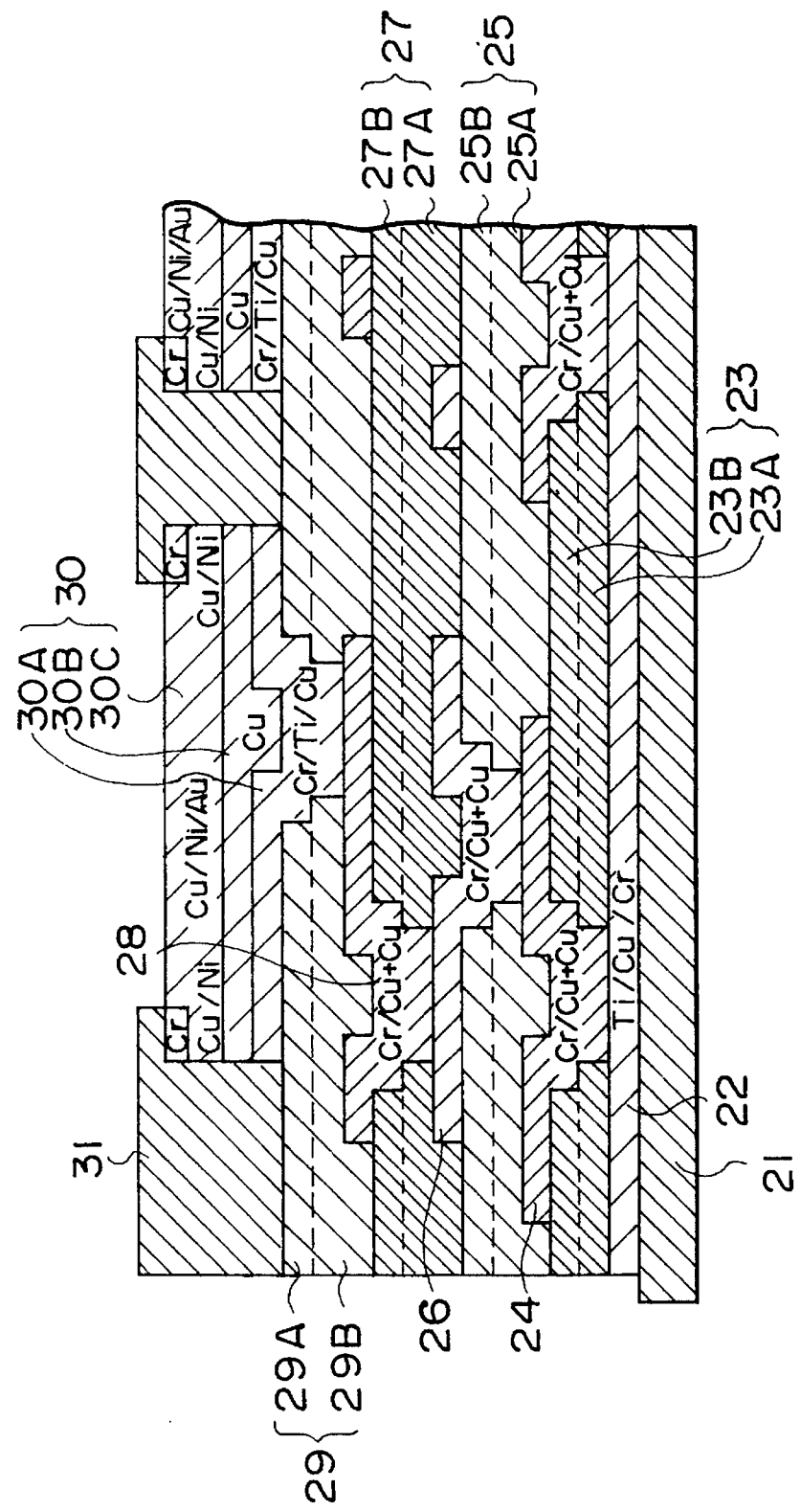
FIG. 4 is a cross sectional view illustrating a thin film multi-layer wiring board having a structure according to an embodiment of the present invention.

Referring to FIG. 4, a substrate 21 is made of AlN. A metal thin film layer 22 used as a ground electrode layer is formed on the substrate 21. An interlayer insulation layer 23 is stacked on the metal thin film layer 22. The interlayer insulation layer 23 is formed of a lower layer portion 23A and an upper layer portion 23B (a dotted line shown in FIG. 4 indicates a boundary line between the lower layer portion 23A and the upper layer portion 23B). The interlayer insulation layer 23 is made of the photosensitive low thermal expansion type polyimide. It is preferable that the thermal expansion coefficient of this low thermal expansion type polyimide is equal to or less than $2\times10^{-5}/°C$. In this embodiment, the thermal expansion coefficient of the low thermal expansion type polyimide is equal to $1.2\times10^{-5}/°C$. This low thermal expansion type polyimide has a Young's modulus value of about 600 kg/mm$^2$ (see FIG. 2).

A metal thin film layer 24 used as a power electrode layer is formed on the interlayer insulation layer 23. An interlayer insulation layer 25 is formed on the metal thin film layer 24. A metal thin film layer 26 used as a signal electrode layer is stacked on the interlayer insulation layer 25, and an interlayer insulation layer 27 is formed on the metal thin film layer 26. Further, a metal thin film layer 28 used as a signal electrode layer is formed on the interlayer insulation layer 27. The interlayer insulation layers 25 and 27 are made of the photosensitive low thermal expansion type polyimide, and respectively formed of lower layer portions 25A and 27A and upper layer portions 25B and 27B.

An interlayer insulation layer 29 is stacked on the metal thin film layer 28. The interlayer insulation layer 29 is formed of a lower layer portion 29A and an upper lower portion 29B. The lower layer portion 29A of the interlayer insulation layer 29 is made of the low thermal expansion type polyimide having the above thermal expansion coefficient. The upper layer portion 29B of the interlayer insulation layer 29 is made of polyimide having a small Young's modulus value which is less than that of the low thermal expansion type polyimide. It is preferable that the Young's modulus values of the polyimide of which the upper layer portion 29B is made is equal to or less than 450 kg/mm². In this embodiment, the upper layer portion 29B of the interlayer insulation layer 29 is made of polyimide having a small Young's modulus value 320 kg/mm². This polyimide has the thermal expansion coefficient of about $3.1 \times 10^{-5}$/°C. (see FIG. 2).

A metal thin film layer 30 is formed on the interlayer insulation layer 29. The metal thin film layer 30 is formed of an upper layer portion 30A, a middle layer portion 30B and a lower layer portion 30C. A surface protection layer 31 is formed on the metal thin film layer 30. The surface protection layer 31 is made of polyimide having the above small Young's modulus value. The metal thin film layer 30 which is an exposed layer is provided with I/O pins which relays signals between an external unit and this wiring board, the I/O pins being fixed on the metal thin film layer 30 by solder.

In the thin film multi-layer wiring board of this embodiment, the surface protection layer 31 which is positioned at the top of this wiring board and the interlayer insulation layer 29B adjacent to the surface protection layer 31 are made of the polyimide having the small Young's modulus value. Thus, even if the hard-baking process is applied to the layers, the layers are not made be friable. That is, even if the I/O pins fixed on the metal thin film layer 30 by solder is pushed by a predetermined force in a direction parallel to the surface of the metal thin film layer 30, the surface protection layer 31 and the interlayer insulation layer 29B both of which substantially support the I/O pins are not broken although the I/O pins may be broken or bent.

In this embodiment, since all the interlayer insulation layers other than the surface protection layer 31 and the interlayer insulation layer 29B are made of the low thermal expansion type polyimide, there is not the remotest case where the thin film multi-layer wiring board is bent caused by the residual stress generated in the interlayer insulation layers.

A description will now be given, with reference to FIGS. 5A–5D, 6A–6C, 7A, 7B, 8A, 83 and 9, of a method for manufacturing the thin film multi-layer wiring board described above.

In step 1 shown in FIG. 5A, Ti, Cu and Cr are successively sputtered on the substrate 21 so that a thin film is formed on the substrate 21. After an etching resist is formed on the thin film, the thin film is patterned by etching so that the metal thin film layer 22 having a predetermined shape is formed. The metal thin film layer 22 functions as the ground electrode layer.

In step 2 shown in FIG. 5B, the interlayer insulation layer 23 is formed on the metal thin film layer 22. A lower layer portion 23A and an upper layer portion 23B are separately made of the photosensitive low thermal expansion polyimide using the exposure and drawing technique so that the interlayer insulation layer 23 is formed (a dotted line shown in FIG. 5B indicates a boundary line between the lower layer portion 23A and the upper layer portion 23B). When the lower layer portion 23A (an interlayer insulation layer 23A) is formed, the pre-baking process is performed for the stacked structure. Further, when the upper layer portion 23B (an interlayer insulation layer 23B) is formed, the hard-backing process is performed for the stacked structure. In the pre-baking process, the stacked structure is heated, for example, at about 80° C. for a predetermined time. In the hard-baking process, the stacked structure is heated, for example, at about 210° C. for a predetermined time.

After this, in step 3 shown in FIG. 5C, Cr, Cu and Cr are successively sputtered on the interlayer insulation layer 23. After a plating resist having a predetermined pattern is formed on a thin film formed of Cr, Cu and Cr layers, parts of the Cr layer which parts are not covered by the plating resist are etched so that the Cu layer is exposed at these parts. Portions at which the Cu layer is exposed are plates with Cu.

After the plating resist is removed from the stacked structure, in step 4 shown in FIG. 5D, the metal thin film layer 24 having a predetermined shape is formed by the panel etching process (Cr/Cu/Cr).

Figure 6A:
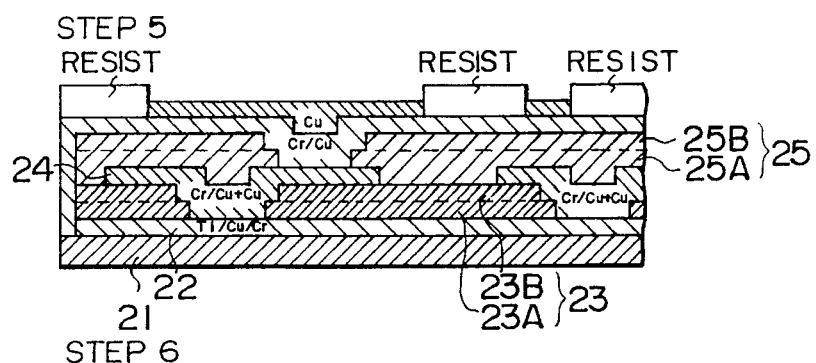

After the metal thin film layer 24 is formed, in step 5 shown in FIG. 6A, the interlayer insulation layer 25 made of the polyimide is formed of the metal thin film layer 24. The interlayer insulation layer 25 is formed in the same manner as the interlayer insulation layer 23 described above. That is, a lower layer portion 25A and an upper layer portion 25B are separately formed by use of the photosensitive low thermal expansion type polyimide (a dotted line shown in FIG. 6A indicates a boundary line between the lower layer portion 25A and the upper layer portion 25B). Further, Cr and Cu are successively sputtered on the interlayer insulation layer 25. After a plating resist is formed on a thin film including the Cr and Cu layers, the thin film is plated with Cu.

Figure 6B:
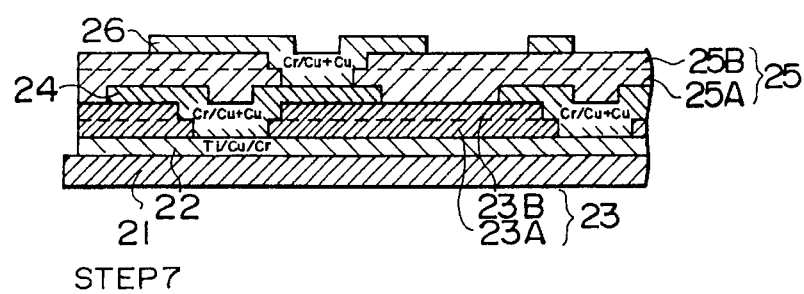

After the thin film is plated with Cu, in step 6 shown in FIG. 6B, the plating resist is removed from the stacked structure. A dry-etching process using an ion-trimming technique is applied to the Cu layer, and a panel etching process is then applied to the Cr layer. As a result, the metal thin film layer 26 used as the signal electrode layer having a predetermined shape is formed.

Figure 6C:
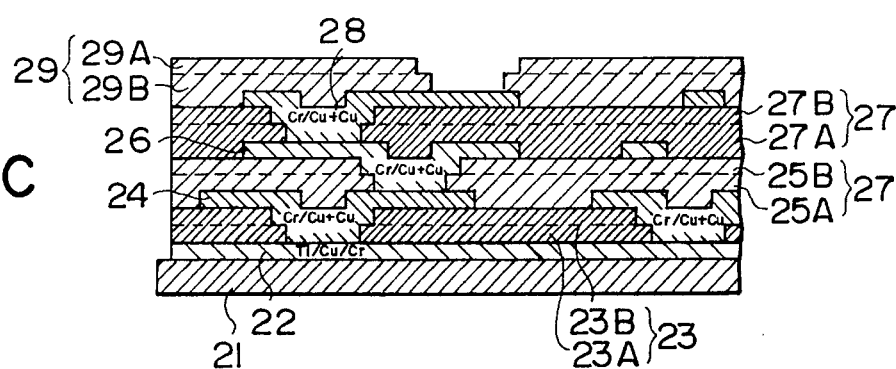

In step 7 shown in FIG. 6C, the interlayer insulation layer 27 made of the polyimide is formed on the metal thin film layer 26 in the same manner as the interlayer insulation layer 23. That is, a lower layer portion 27A and an upper layer portion 27B are separately made of the photosensitive low thermal expansion type polyimide (a dotted line in FIG. 6C indicates a boundary line between the lower layer portion 27A and the upper layer portion 27B). Cr and Cu are then successively sputtered on the interlayer insulation layer 27 so that a thin film is formed. After a plating resist is formed on the thin film, the thin film is plated with Cu. After the plating resist is removed from the stacked structure, the dry-etching process using the ion-trimming technique is applied to the Cu layer, and the panel etching process is then applied to the Cr layer. As a result, the metal thin film layer 28 used as the signal electrode layer having a predetermined shape is formed. An interlayer insulation layer 29 is then formed on the metal thin film layer 28.

As to the interlayer insulation layer 29, a lower layer portion 29A and an upper layer portion 29B are separately formed in the same manner as the interlayer insulation layer 23 (a dotted line shown in FIG. 6C indicates a boundary line between the lower layer portion 29A and the upper layer portion 29B). However, although the lower layer portion 29A of the interlayer insulation layer 29 is made of the low thermal expansion type polyimide in the same manner as the interlayer insulation layer 23, the upper layer portion 29B thereof is made of the polyimide having a small Young's modulus value. Before the interlayer insulation layer 29B (the upper layer portion of the interlayer insulation layer 29) is formed on the interlayer insulation layer 29A the lower layer portion of the interlayer insulation layer 29), the hard-baking process is performed for the interlayer insulation layer 29B and a surface toughening process is applied to the interlayer insulation layer 29B. In the surface roughening process, for example, a plasma treatment is performed under a condition in which $O_2:CF_2:N_2=90:3:7$.

Figure 7A:
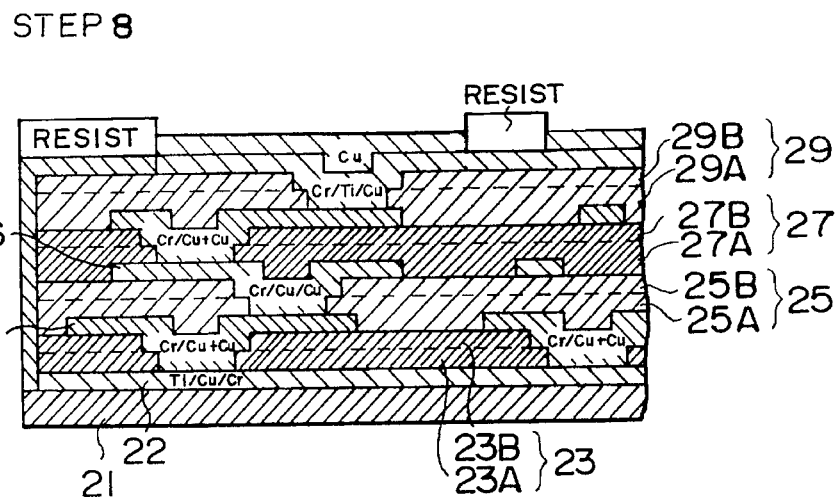

After this, in step 8 shown in FIG. 7A, Cr, Ti and Cu are successively sputtered on the interlayer insulation layer 29 so that a thin film is formed. After the a plating resist is formed on the thin film, the thin film is plated with Cu.

Figure 7B:
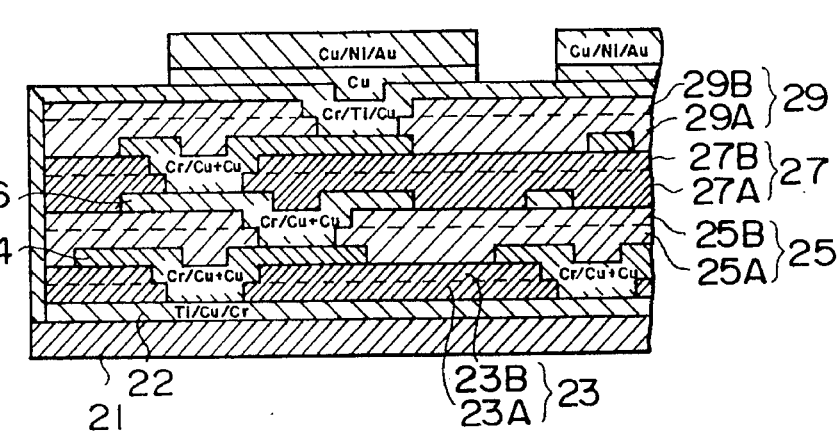
Figure 9:
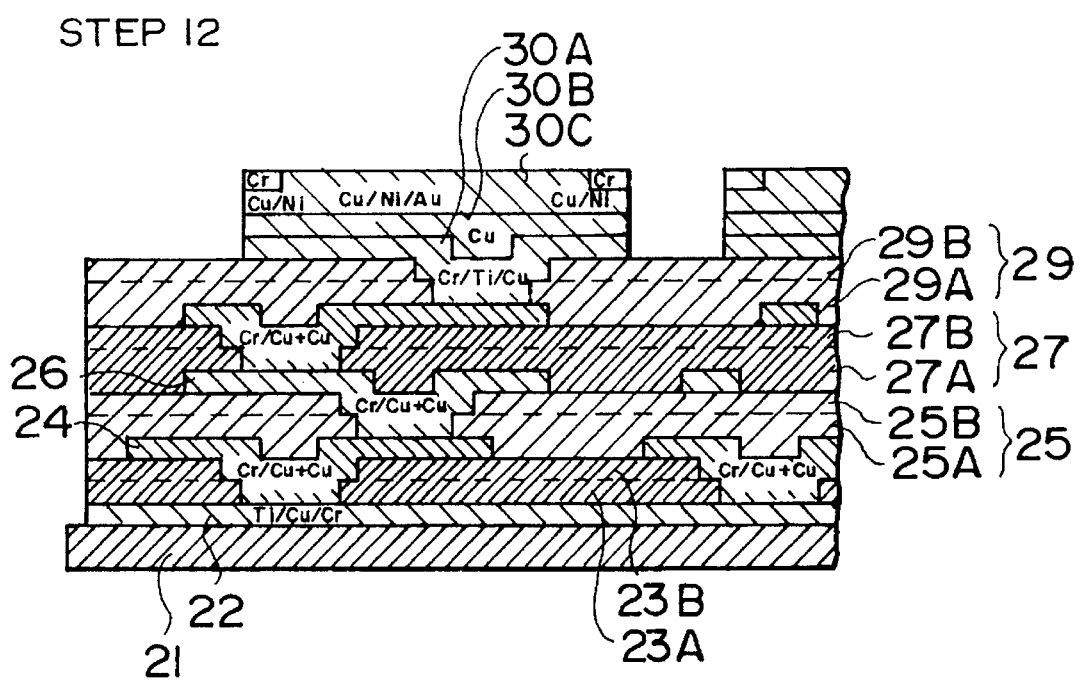

After the plating resist is removed from the stacked structure, in step 9 shown in FIG. 7B, Cr is sputtered on the whole surface of the stacked structure and a plating resist is formed thereon. Parts of the Cr layer on which the plating resist is not formed are etched so that the Cu layer is exposed in corresponding portions. The exposed Cu layer is successively plated with Cu, Ni and Au. After this, the plating resist is removed and the Cr layer is etched.

Next, in step 10 shown in FIG. 8A, an etching resist (Au/Cu) is formed on the thin film. The dry-etching process (Au/Cu)) and the panel etching process (Ti/Cr) are respectively performed. In step 11 shown in FIG. 8B, after the etching resist is removed from the stacked structure, a lift-off resist is formed on the thin film and the lift-off sputtering of Cr is performed. After this, in step 12 shown in FIG. 9, the lift-off resist is removed from the stacked structure, so that the metal thin film layer 30 which is the surface layer is formed.

After this, the surface protection layer made of the polyimide having a small Young's modulus value is formed. As a result, the thin film multi-layer wiring board having the structure as shown in FIG. 4 is completed.

According to the above method, after the hard-baking process is performed for the interlayer insulation layer 29A made of the low thermal expansion type polyimide, the surface roughening process using the plasma treatment is applied to the interlayer insulation layer 29A. After this, the interlayer insulation layer 29B made of the polyimide having the low Young's modulus value is formed on the interlayer insulation layer 29B so that the interlayer insulation layer 29 is completed. Thus, although the interlayer insulation layers 29A and 29B are made of different types of polyimide, they can be firmly connected to each other. Thus, the interlayer insulation layers 29A and 29B are not removed from each other. As a result, the supporting strength by which the surface protection layer 31 and the interlayer insulation layer 29B support the I/O pints is further improved.

In addition, all the interlayer insulation layers 23, 25, 27 and 29A other than the surface protection layer 31 and the interlayer insulation layer 29B are formed of the low thermal expansion type polyimide. Thus, many layers made of the low thermal expansion type polyimide are included in the thin film multi-layer wiring board. As a result, the warp of the board caused by the residual stress in the layers made of the polyimide is small.

The number of metal thin film layers and the number of the interlayer insulation layers are not limited to those in the above embodiment. The number of layers depends on a type of the wiring board.

Two or more interlayer insulation layers, located in the upper layer side in the board, including at least the interlayer insulation layer 29B adjacent to the surface protection layer 31 may be polyimide having a small Young's modulus value.

The surface roughening process may be performed using a treatment other than the plasma treatment.

The present invention is not limited to the aforementioned embodiments, and variations and modifications may be made without departing from the scope of the claimed invention.

What is claimed is:

1. A thin film multi-layer structure comprising:

a plurality of metal thin film layers; and a plurality of layers made of polyimide, said plurality of metal thin film layers and said plurality of layers made of polyimide being stacked together in a stacked structure, said plurality of layers made of polyimide being grouped into a first group and a second group including at least a layer located at a top of said plurality of layers, wherein a Young's modulus value of the polyimide of which each layer in said second group is made is less than that of the polyimide of which each layer in said first group is made and a thermal expansion coefficient of the polyimide of which each layer in said first group is made is less than that of the polyimide of which each layer in said second group is made.

2. The thin film multi-layer structure as claimed in claim 1, wherein a layer adjacent to the layer located at the top of said plurality of layer made of polyimide is included in said second group.

3. The thin film multi-layer structure as claimed in claim 1, wherein a number of layers in said second group is less than a number of layers in said first group.

4. The thin film multi-layer structure as claim in claim 1, wherein any layer in said second group is located at a higher position than any layer in said first group in the stacked structure of said plurality of metal thin film layers and said plurality of layers made of polyimide.

5. The thin film multi-layer structure as claimed in claim 1, wherein the Young's modulus value of the polyimide of which the layer in said second group is made is less than 450 kg/mm$^2$.

6. The thin film multi-layer structure as claimed in claim 1, wherein the thermal expansion coefficient of the polyimide of which the layer in said first group is made is less than $2\times10^{-5}/°C$.

7. A manufacturing method of a thin film multilayer structure comprising the steps of:

a) forming a first structure including a plurality of metal thin film layers and a plurality of layers made of polyimide which are stacked together in a stacked structure; and b) forming a second structure on said first structure, said second structure including at least a layer made of polyimide which layer is located at a top of said second structure, wherein a Young's modulus of the polyimide of which each layer in said second structure is made is less than that of the polyimide of which each layer in said first structure is made and a thermal expansion coefficient of the polyimide of which each layer in said first structure is made is less than that of the polyimide of which each layer in said second structure is made.

8. The method as claimed in claim 7, wherein a number of layers made of polyimide in said second structure is less than a number of layers made of polyimide in said first structure.

9. The method as claimed in claim 7, wherein the Young's modulus value of the polyimide of which the layer in said second structure is made is less than 450 kg/mm$^2$.

10. The method as claimed in claim 7, wherein the thermal expansion coefficient of the polyimide of which the layer in said first structure is less than $2 \times 10^{-5}$/°C.

11. The method as claimed in claim 7, wherein one of said plurality of layer made of polyimide being located at a top of said first structure, said method further comprising the steps of:

c) applying a surface roughening process to the layer located at the top of said first structure; and d) connecting a layer in said second structure, which layer is located at a bottom of said second structure, to the layer located at the top of said first structure.

12. The method as claimed in claim 11, wherein the layer connected to the layer located at the top of said first structure is adjacent to the layer located at the top of said second structure.

13. The method as claimed in claim 11, wherein said surface toughening process uses a plasma treatment.

* * * * *